United States Patent
Abedifard et al.

(10) Patent No.: US 6,621,751 B1
(45) Date of Patent: Sep. 16, 2003

(54) METHOD AND APPARATUS FOR PROGRAMMING ROW REDUNDANCY FUSES SO DECODING MATCHES INTERNAL PATTERN OF A MEMORY ARRAY

(75) Inventors: Ebrahim Abedifard, Sunnyvale, CA (US); Frankie Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/160,063

(22) Filed: Jun. 4, 2002

(51) Int. Cl.$^7$ ................................................ G11C 7/00
(52) U.S. Cl. ................ 365/200; 365/225.7; 365/230.06
(58) Field of Search ............................... 365/200, 201, 365/230.06, 185.09, 225.7, 185.33

(56) References Cited

U.S. PATENT DOCUMENTS 4,494,220 A * 1/1985 Dumbri ...................... 365/200
6,212,111 B1 * 4/2001 Wright et al. ............... 365/200
6,314,030 B1  11/2001 Keeth ........................ 365/200

* cited by examiner

Primary Examiner—Tan T. Nguyen
(74) Attorney, Agent, or Firm—Dickstein Shapiro Morin & Oshinsky LLP

(57) ABSTRACT

A memory device includes circuitry for replacing row pairs of primary memory having odd-even or even-odd addresses with rows of redundant memory having a corresponding odd-even or even-odd address pairing. The replacement memory rows maintain the odd-even address pairing of the primary memory rows being replaced which facilitates memory testing. The memory is loaded with a uniform test pattern, such as a checkerboard. When adjacent row pairs found to be defective are replaced with a corresponding pair of redundant memory rows, the uniform checkerboard pattern is maintained. Consequently, it is not necessary to load the test pattern into the redundant memory rows after replacement, thereby reducing the number of process steps and time required.

13 Claims, 3 Drawing Sheets

METHOD AND APPARATUS FOR PROGRAMMING ROW REDUNDANCY FUSES SO DECODING MATCHES INTERNAL PATTERN OF A MEMORY ARRAY

BACKGROUND OF THE INVENTION

1. Field of the Invention

The present invention relates generally to redundancy repair of integrated circuit memory devices, and more particularly to a memory device having row redundancy repair.

2. Brief Description of the Related Art

Electronic memory, including read only memory (ROM), flash memory, and random access memory (RAM) devices, such as DRAMs and SRAMs, typically utilize memory arrays having rows and columns of memory cells for storing data. Manufactured memory arrays are tested for integrity, and defects are repaired. Typical tests involve writing data to the array using an external pattern, and reading the pattern back to confirm that the data is stored accurately.

When testing reveals a defective primary row or column, a non-defective redundant row or column is used to replace the defective primary row or column. This is achieved with fuses or anti-fuses that set hardwired latches associated with the defective row or column and map the address of the defective primary row or column to a fully-operable redundant row or column. With this re-mapping, all attempts to access the defective row or column will be redirected to the redundant row or column known to be properly working. The remapping process and logical substitution of the redundant region is transparent to the end user. U.S. Pat. No. 6,314,030 to Keeth, the entire disclosure of which is incorporated herein by reference, further describes memory circuit device testing and repair using redundant memory.

Testing memory devices by writing data to the array is a relatively slow process, especially for flash memory. During such memory testing, one bit pattern which is used employs a repetitive bit pattern, for example, of alternating ones and zeroes arranged in a "checkerboard" or inverse "checkerboard" pattern throughout the memory array. The pattern is written in blocks to the flash memory array.

The checkerboard testing pattern is obtained by loading each row of the flash memory array with an alternating series of 1's and 0's. The checkerboard pattern alternates from row to row, thus, even rows (rows 0, 2, 4, etc.) are loaded with a repeating pattern of 0's and 1's (0-1-0-1 . . . ), while odd rows (1, 3, 5, etc.) are loaded with a repeating pattern of 1's and 0's (1-0-1-0 . . . ).

A short between adjacent cells in two adjacent memory rows is a typical fault in a flash memory array, which requires replacement of the shorted pair of rows with a corresponding pair of redundant rows. Each pair of bad rows will be either an even and odd row (e.g., rows 2 and 3, for example), or an odd and even row (e.g., rows 3 and 4).

A flash memory device typically is divided into several memory banks, each of which is further divided into a plurality of memory blocks. Each memory block is provided with a number of primary rows and a lesser number of redundant rows, the latter bit available for repairing faulty primary rows in the associated block. Pattern writing during testing includes writing the pattern to the primary rows of the memory block, as well as to the redundant rows of the block, as these too must be tested for integrity. If a defective primary row is replaced by a redundant row during testing, the testing pattern must be rewritten to the block with the redundant row receiving the same bit pattern as the replaced defective row, for further testing. This is a time consuming process.

BRIEF SUMMARY OF THE INVENTION

The present invention provides an easier way to test primary rows and redundant rows in memory blocks, and to substitute redundant rows for defective primary rows while permitting continued testing without requiring a rewrite of the testing pattern. In the invention, pairs of defective rows of memory are replaced with redundant rows having an odd-even row pairing which matches the odd-even row pairing of the defective row pair. Consequently, a loaded test pattern of a redundant row used for repair matches that of the defective row which requires repair. This avoids having to rewrite the test pattern when making a repair using redundant rows and saves time in testing the memory.

A memory device according to the present invention includes memory blocks, each block having rows of primary memory cells having either an even or an odd address. Each memory block also includes at least two rows of redundant memory cells. Like each primary memory row, each row of redundant memory has an even or an odd row address. In each adjacent row pair, whether a primary or redundant row, one row has an even address, and the other row has an odd address.

During testing, the memory block is pre-loaded with an external test pattern, such as a checkerboard pattern, the arrangement of which alternates a "1" and "0" pattern at each column and with each row, as shown in the example in the Table below:

TABLE

Memory cells loaded with alternating (checkerboard) pattern.

| | | | | | | | |
|---|---|---|---|---|---|---|---|
| EVENROW <0> | 0 | 1 | 0 | 1 | 0 | 1 | 0 . . . |
| ODDROW <1> | 1 | 0 | 1 | 0 | 1 | 0 | 1 . . . |

Upon detection of a failed odd-even or even-odd pair of primary memory rows, circuitry in the memory device remaps using programmed coding the addresses of the defective pair of adjacent rows, to a corresponding odd-even or even-odd pair of redundant rows as replacements. Advantageously, the replacement redundant rows have addresses that correspond correctly (odd or even) with the odd or even addresses of the replaced primary rows. By using the correct odd-even or even-odd pairing of redundant rows as replacements, the pre-loaded test pattern (checkerboard) will not change and need not be rewritten during further testing, so the pattern that is read out from the replacement redundant rows does not change from that of the replaced primary rows of the block during the further testing. The test pattern used need not be a checkerboard. Any pattern can be utilized that distinguishes even and odd rows, and preferably allows detection of failed row pairs.

Although preferred embodiments of the present invention are described with respect to repairing rows of memory arrays, the invention is not so limited. Repairs of shorted columns, for example, also could take place in odd/even pairs utilizing the teachings of the present invention.

The above advantage and features of the invention will be better understood from the following detailed description which is provided in connection with the accompanying drawings.

DETAILED DESCRIPTION OF THE INVENTION

Figure 1:
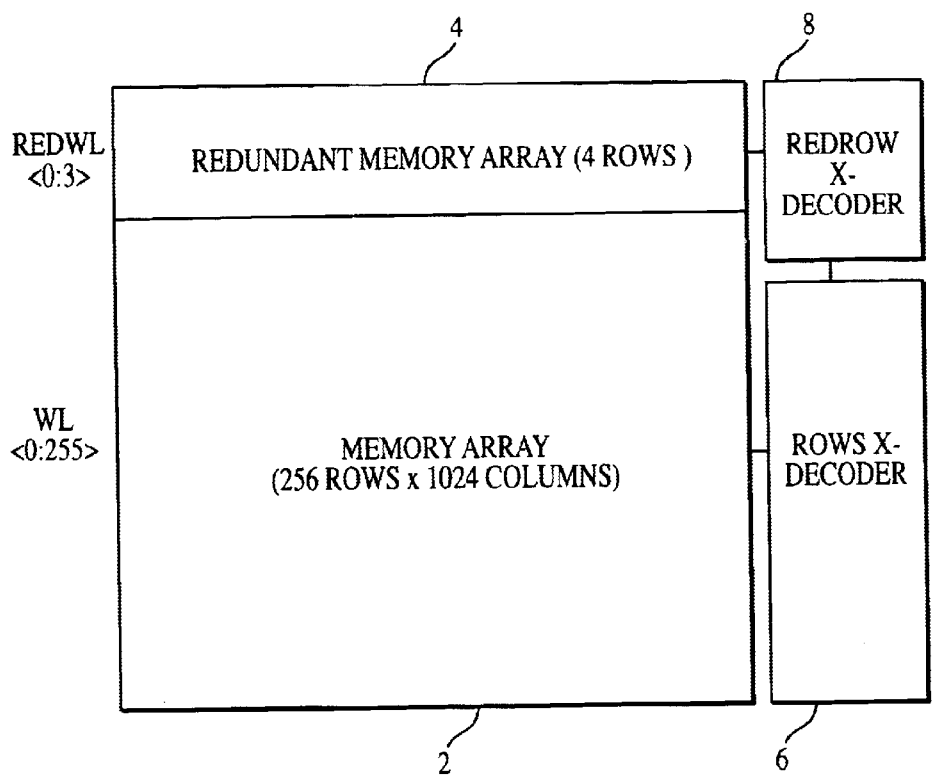
FIG. 1 is a block diagram illustration of a decoding arrangement for a main block memory array and an associated redundant memory array according to the present invention.

Referring initially to FIG. 1, a main block of a flash memory according to the present invention is illustrated. The main block includes a primary memory array 2 having 256 rows of memory cells and redundant memory array 4 having four rows of memory cells. The main and redundant arrays also have, for example, 4096 columns of memory cells. A row decoder (Rows X-Decoder) 6 decodes row addresses for memory array 2. A redundant row decoder (RedRow X-Decoder) 8 decodes row addresses for redundant array 4.

Figure 4:
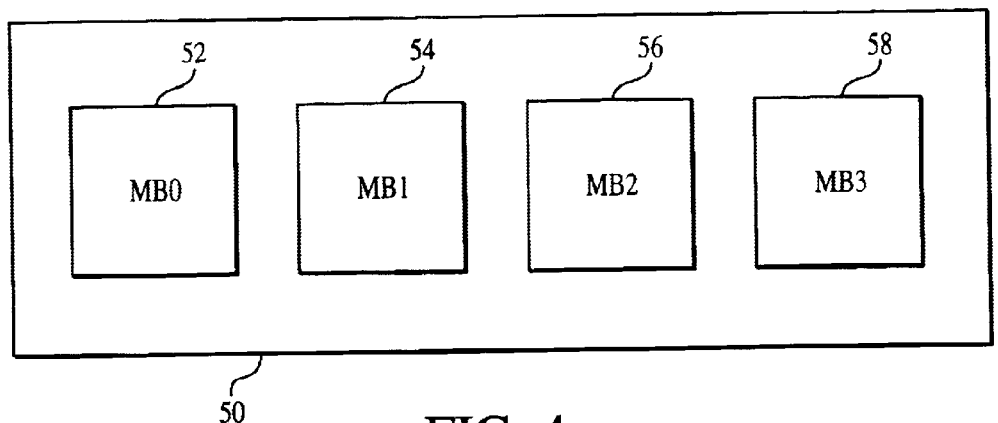
FIG. 4 is a block diagram of a memory device including the row repair circuit according to the present invention.

In a typical adaptation of the present invention a flash memory device 50 has, for example, four memory banks 52, 54, 56, 58 as shown in FIG. 4, each having a plurality of memory blocks, each memory block being arranged as shown in FIG. 1.

The four rows of memory cells in redundant memory array 4 are associated with main memory array 2 for repairing defective rows of memory in the main array. Redundant row decoder 8 stores addresses of defective rows requiring repair and compares them to incoming row addresses for selecting a redundant row for substitution for a primary row which is addressed.

Figure 2:
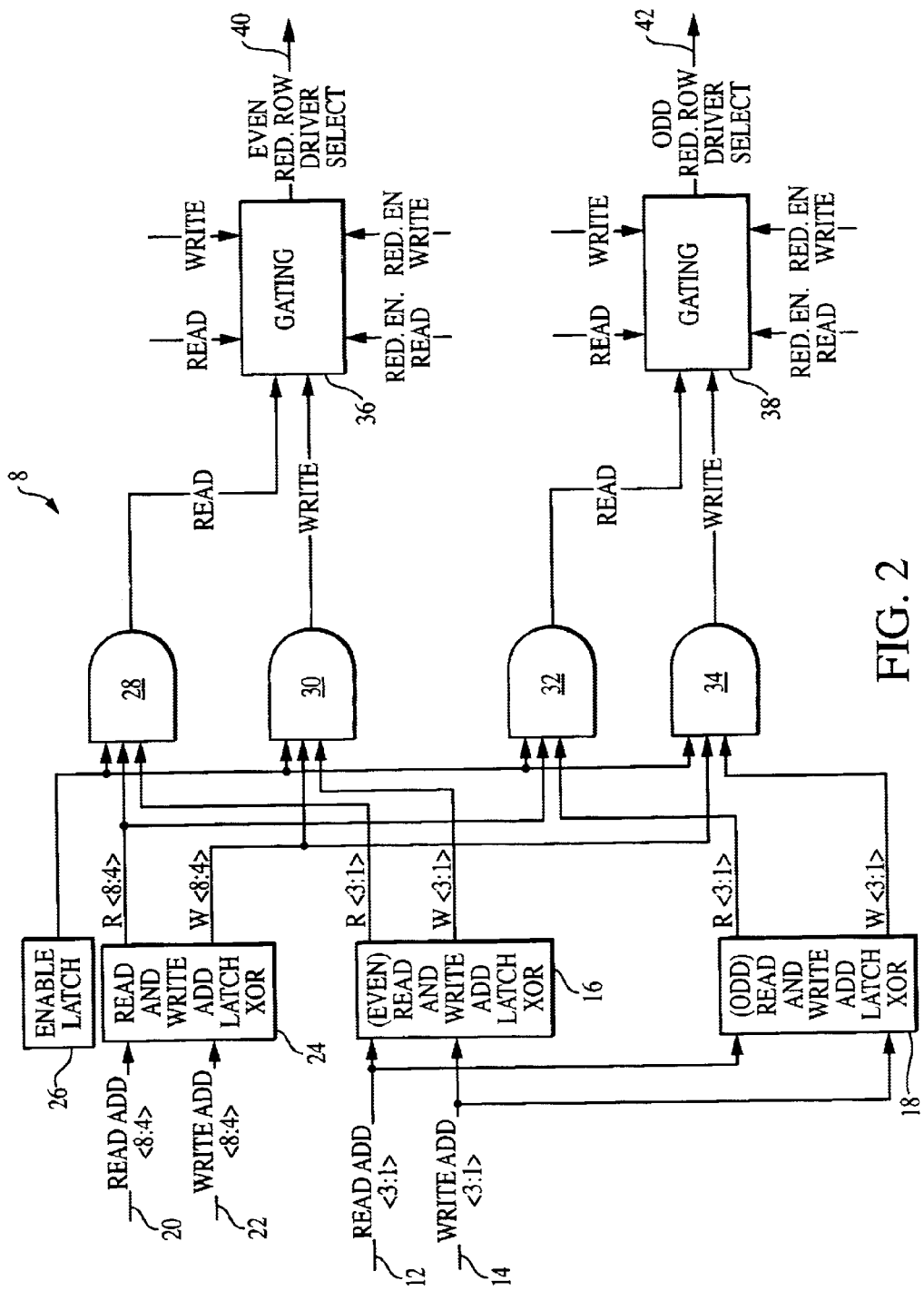
FIG. 2 is a schematic diagram illustrating a row repair circuit according to the present invention.

Redundant row decoder 8 is illustrated in greater detail in FIG. 2. The redundant row decoder 8 includes a latch/XOR circuit 24 for receiving the five higher order bits of a memory address of a defective primary row, and even latch/XOR circuit 16 for receiving the lower three bits of an even row of a defective primary memory row, and a latch/XOR circuit 18 for receiving the lower three bits of a defective primary row. Accordingly, once a pair of adjacent odd and even primary rows are identified as defective during testing the address of the even row of the pair is programmed into the latch/XOR circuits 24 and 16, while the address of the odd row of the pair is programmed into latches 24 and 18.

Figure 3:
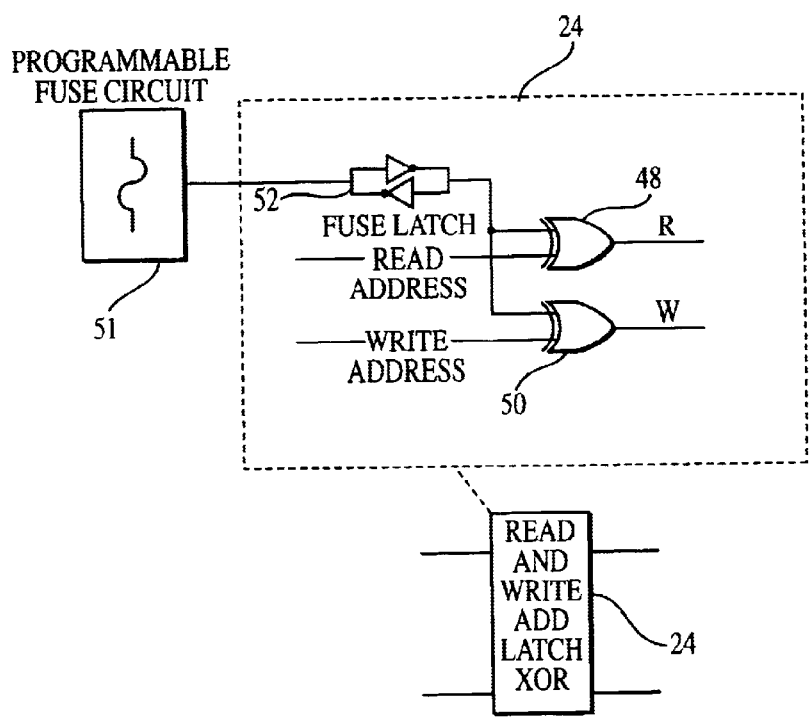
FIG. 3 is a detailed diagram of a portion of one of the latch/XOR circuits shown in the schematic diagram of FIG. 2.

The manner in which the addresses are loaded into the latch/XOR circuits 24, 16, and 18 is illustrated in FIG. 3 which shows the loading of a one bit of the five bit address into the latch/XOR circuit 24. As shown in FIG. 3, a programmable circuit 51 illustrated as a fuse circuit is connected to a fuse latch 52 within the latch/XOR circuit 24 to set the latch to a value determined by the programmed state of the fuse. The output of the fuse latch 52 is coupled to one input each of the XOR gates 48 and 50. XOR gate 48 has another input for receiving a memory read address, while XOR gate 50 has another input for receiving an incoming write address. When a particular bit location from an incoming read address matches that stored in the fuse latch 52, XOR gate 48 provides an output indicating a read match for that bit. Similarly, when an incoming write address bit matches the bit stored in fuse latch 52, the XOR gate 50 provides an output indicating a matched write address for that bit.

Referring back to FIG. 2, the outputs of the latch/XOR circuits 24,16 and 18 are supplied to the four logic gates illustrated as AND gates 28, 30, 32 and 34. AND gate 28 supplies an output signal when an incoming read address is an even address and matches an even address of a defective row stored in latch/XOR circuits 24 and 16. AND gate 30 supplies an output signal for an incoming write address which matches the address stored in latch/XOR circuits 24 and 16. AND gate 32 supplies an output signal when there is a match in an incoming read address with the read address stored in latch/XOR circuits 24 and 18. AND gate 34 provides an output signal when there is a match between an incoming write address and an address stored in latch/XOR circuits 24 and 18. Thus, gates 28 and 30 provide selection signals for a read or write even address which has been matched which are provided to gating circuit 36. Gating circuit 36 receives enable signals as READ, WRITE, RED EN READ, and RED EN WRITE. Accordingly, when a read command is recognized by logic circuits elsewhere in the memory device a signal is applied on the READ command line. When the redundant logic circuitry is operating a signal is also present on the redundant enable (RED EN READ) line which enables a read of a redundant row. When the READ and RED EN READ signals are present and a signal appears at the output of gate 28, gating circuit 36 passes this two line 40 where it is used to select an even redundant row for substitution for the defective even primary row whose address was set in the latch/XOR circuits 24 and 16. Likewise for a write operation if gate 30 supplies a write signal this will be gated to select line 40 to select an even redundant row for substitution for a defective primary row when the WRITE and RED EN WRITE signals are present.

Similarly, line 42 is used to select an odd redundant row for operation. Thus, when gate 32 indicates that an incoming address matches an odd row address stored in latch/XOR circuits 24 and 18 during a read operation, the presence of the READ and RED EN RED signals at gating circuit 38 will cause the output of gate 32 to be applied to line 42 and select an odd redundant row for substitution for the defective primary row whose address is stored in latch/XOR circuits 24 and 18. Likewise, gate 34 supplies a signal to gating circuit 38 when an incoming write address matches the odd row address stored in latch/XOR circuits 24 and 18 and this is gated by gating circuit 38 to line 42 when the WRITE and RED EN WRITE signals are present.

The gates 28, 30, 32, 34 are also enabled by an enable latch 26 which can be programmed to enable or disable operation of the decoder 8 of FIG. 2 as desired.

Thus, whenever a read or write address is presented to the decoder 8, it is compared to the even address stored in the latch/XOR circuits 24 and 16 and the odd address stored in latch/XOR circuits 24 and 18 to determine if an even or odd redundant row needs to be substituted for the primary row being addressed.

By using the same odd-even or even-odd redundant row relationship, the test pattern (checkerboard) bit pattern initially loaded in the memory at the outset of testing will remain consistent. Consequently, subsequent testing based on the pre-loaded checkerboard pattern can take place without re-writing the pattern to the memory. By replacing the rows using the proper odd-even/even-odd relationship, the test pattern read from memory does not change even when defective main rows have been replaced with a pair of redundant memory rows.

Figure 5:
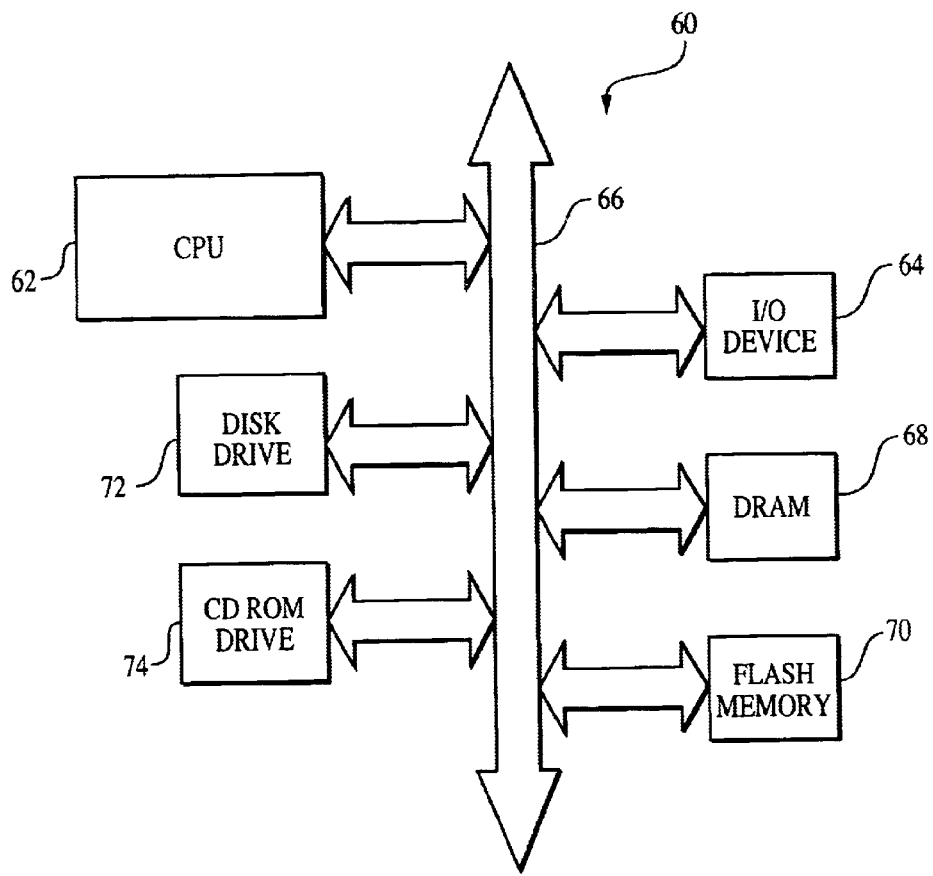
FIG. 5 is a block diagram illustrating a processor system containing a memory device having a row repair circuit according to the present invention.

Referring to FIG. 5, a processor system 60 is shown which uses a flash memory employing memory repair according to the present invention. Processor system 60 generally comprises a central processing unit (CPU) 62, such as a microprocessor, that communicates with one or more input/ output (I/O) devices 64 over a bus 66. The processor system 60 also includes random access memory (RAM) such as DRAM 68. One or more flash memory devices 70 also communicate with CPU 62. In the case of a computer, the system may include peripheral devices such as a floppy disk drive 72 and a compact disk (CD) ROM drive 74 which also communicate with CPU 62 over the bus 66. At least flash memory device 70 is constructed as an integrated circuit which includes circuitry to allow for redundant row repair as previously described. The redundancy repair of the invention can also be used in DRAM 68. It may also be desirable to integrate the CPU 62 and memory 68 and/or 70 on a single IC chip.

It should be noted that while the preferred embodiment of the invention is described as applied to a flash memory device having typical row addressable architecture, the invention is not so limited and may be applied to other memory devices, including but not limited to DRAM, SRAM, SDRAM, as well as other memory devices, having different architectures and various sizes. Additionally, while the invention has been described with reference to four banks of memory containing a plurality of main blocks, the invention is not so limited and any number of banks and blocks can be used. Likewise, the number of rows and columns of cells in a memory block, and the number (of redundant rows can be varied from the memory block structure described above without departing from the spirit and scope of the invention. It is also noted that the FIG. 2 circuit can be replicated, that is, a plurality of FIG. 2 circuits can be provided, to address additional even and odd redundant rows, beyond the two shown in FIG. 2.

The present invention provides an apparatus and method for repairing pairs of rows in a memory array with matching odd-even or even-odd redundant rows utilizing fuses 51 for storing the addresses of failed primary rows of the memory array. The fuses are used for setting latches 52 to store address information of defective rows. It will be evident to those of skill in the art that other types of programmable memory devices, such as anti-fuses, or other programmable devices, could be substituted in place of the fuses to set latches 52.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. A memory device comprising:
   a memory array including rows of primary memory cells and rows of redundant memory cells, the address of each row being odd or even; and
   row repair circuitry for decoding incoming row addresses and replacing pairs of redundant memory rows for defective pairs of adjacent primary rows, with a redundant odd row replacing a defective primary odd row and a redundant even row replacing a defective primary even row.

2. The memory device of claim 1, wherein said repair circuitry includes a first repair circuit comprising a first storing circuit for storing an odd address of a defective pair of adjacent primary rows and a second storing circuit for storing an even address of a defective pair of adjacent primary memory rows.

3. The memory device of claim 2, wherein said repair circuitry includes a plurality of said first repair circuits.

4. The memory device of claim 1, wherein the memory array is a flash memory array.

5. A memory device comprising:
   at least one memory bank comprising a plurality of memory blocks, each said memory block having primary memory cell rows and redundant memory cell rows, an address of each row being odd or even; and
   row repair circuitry associated with each memory block for decoding primary row addresses of the associated memory block, the row repair circuitry operating to enable a selected pair of redundant memory rows of a memory block to replace a defective pair of adjacent primary rows of the block with a redundant odd row replacing a defective odd primary row and a redundant even row replacing a defective even primary row.

6. A memory device according to claim 5, wherein said memory device is a flash memory device.

7. A processor system comprising:
   a central processing unit; and
   a memory device for exchanging data with the central processing unit, the memory device comprising:
      a memory array including rows of primary memory cells and rows of redundant memory cells, the address of each row being odd or even; and
      row repair circuitry for decoding incoming row addresses and replacing pairs of redundant memory rows for defective pairs of adjacent primary rows, with a redundant odd row replacing a defective primary odd row and a redundant even row replacing a defective primary even row.

8. The processor system of claim 7, wherein the memory device is a flash memory device.

9. A method of testing memory cells of a memory device having a memory array of cells arranged in rows and columns, said rows being divided into a primary rows and redundant rows, said method comprising the steps of:
   loading a bit pattern in said cells of said memory array such that all even address primary and redundant rows have the same first bit pattern and all odd address primary and redundant rows have the same second bit pattern different from the first bit pattern;
   using said bit pattern to identify at least one defective primary row which needs repair; and
   programming said memory device to repair said at least one defective primary row such that an even redundant row is substituted for an even defective primary row and an odd redundant row is substituted for an odd defective primary row.

10. The method of claim 9, wherein said bit pattern is a checkerboard pattern.

11. The method of claim 9, wherein said redundant row substituted for a defective primary row retains said bit pattern, whereby it is unnecessary to rewrite said bit pattern to said substituted redundant row.

12. A method of operating a memory device comprising the steps of:
  receiving an address for an accessed primary row in a memory array;
  determining if said accessed primary row was repaired as part of a repaired pair of odd and even defective adjacent primary rows and, if so,
  replacing said primary row with a redundant row which has an odd/even address which matches the odd/even address of said primary row.

13. The method of claim 12, wherein the redundant row is pre-loaded with a bit pattern that matches a pre-loaded bit-pattern of said primary row.

* * * * *